(12) United States Patent
Zhang et al.

(10) Patent No.: US 10,721,576 B2
(45) Date of Patent: Jul. 21, 2020

(54) MEMS MICROPHONE AND METHOD FOR MANUFACTURING THE SAME

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Jian Zhang, Shanghai (CN); Jingxiu Ding, Shanghai (CN)

(73) Assignees: SEMICONDUCTO MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/897,016

(22) Filed: Feb. 14, 2018

(65) Prior Publication Data
US 2018/0317033 A1 Nov. 1, 2018

(30) Foreign Application Priority Data
Mar. 21, 2017 (CN) .......................... 2017 1 0167444

(51) Int. Cl.
*H04R 19/00* (2006.01)
*H04R 31/00* (2006.01)
(Continued)

(52) U.S. Cl.
CPC ........... *H04R 31/003* (2013.01); *B81B 3/007* (2013.01); *B81B 3/0051* (2013.01);
(Continued)

(58) Field of Classification Search
CPC .... H04R 31/003; H04R 19/005; H04R 19/04; H04R 2201/003; H04R 2231/003;
(Continued)

(56) References Cited

U.S. PATENT DOCUMENTS 8,218,796 B2 * 7/2012 Tanaka ................... H04R 31/00
  381/121
8,921,957 B1 12/2014 Zhang et al.
(Continued)

FOREIGN PATENT DOCUMENTS

CN        1728888 A      2/2006
CN      103281661 A      9/2013
(Continued)

*Primary Examiner* — Tuan D Nguyen
(74) *Attorney, Agent, or Firm* — Kilpatrick Townsend & Stockton LLP

(57) ABSTRACT

A semiconductor device includes a substrate having an opening extending through the substrate and at least one support member on a sidewall of the opening, a vibration membrane on the substrate, a cover layer on the vibration membrane. The substrate, the vibration membrane, and the cover layer define a cavity. The opening exposes a lower surface portion of the vibration membrane. The at least one support member on the sidewall of the opening provides support to the vibration membrane in a deformation of the vibration membrane to prevent breakage.

11 Claims, 7 Drawing Sheets

(51) Int. Cl.
 *B81B 3/00* (2006.01)
 *B81C 1/00* (2006.01)
 *H04R 19/04* (2006.01)
 *H04R 7/18* (2006.01)
(52) U.S. Cl.
 CPC ...... *B81C 1/00158* (2013.01); *B81C 1/00476* (2013.01); *B81C 1/00658* (2013.01); *H04R 19/005* (2013.01); *B81B 2201/0257* (2013.01); *B81B 2203/0127* (2013.01); *B81B 2203/0315* (2013.01); *B81B 2203/04* (2013.01); *B81C 2201/0105* (2013.01); *B81C 2201/0133* (2013.01); *H04R 7/18* (2013.01); *H04R 19/04* (2013.01); *H04R 2201/003* (2013.01); *H04R 2231/003* (2013.01); *H04R 2307/025* (2013.01)
(58) Field of Classification Search
 CPC .............. H04R 2307/025; B81B 3/007; B81B 2201/0257; B81B 2203/0127; B81B 2203/0315; B81B 2203/04; B81C 2201/0105; B81C 2201/0133
 See application file for complete search history.

(56) References Cited

U.S. PATENT DOCUMENTS

| 2007/0261910 | A1* | 11/2007 | Kasai | G01H 11/06 181/142 |
| 2008/0006093 | A1* | 1/2008 | Ueya | H04R 19/005 73/724 |
| 2008/0232615 | A1* | 9/2008 | Song | H04R 19/005 381/174 |
| 2011/0215067 | A1 | 9/2011 | Nomura | |
| 2014/0291786 | A1* | 10/2014 | Zoellin | H04R 19/04 257/416 |
| 2015/0078592 | A1* | 3/2015 | Uchida | H04R 19/04 381/191 |

FOREIGN PATENT DOCUMENTS

| CN | 103688556 A | 3/2014 |
| CN | 104113812 A | 10/2014 |
| CN | 105307091 A | 2/2016 |

* cited by examiner

MEMS MICROPHONE AND METHOD FOR MANUFACTURING THE SAME

CROSS-REFERENCES TO RELATED APPLICATIONS

The present application claims priority to Chinese patent application No. 201710167444.8, filed with the State Intellectual Property Office of People's Republic of China on Mar. 21, 2017, the content of which is incorporated herein by reference in its entirety.

FIELD OF INVENTION

The present invention relates to semiconductor technology, and more particularly to a MEMS microphone and a method for manufacturing the same.

BACKGROUND OF THE INVENTION

In the field of electro-acoustic products, the microphone is a sensor that converts acoustic energy into electrical energy. A capacitive micro-electro-mechanical system (MEMS) microphone generally includes a vibration membrane, a fixed plate (back plate), and a cavity between the vibration membrane and the fixed plate. A capacitive MEMS microphone enables detection of a capacitive value change due to the displacement of the vibration membrane caused by a change in the acoustic pressure, and the detected capacitive value change is then converted to an electrical signal for processing.

In some MEMS microphones, the cavity is formed using a wet etch (e.g., a buffered oxide etch) process to remove $SiO_2$, so that the vibration membrane can move in the cavity.

FIG. 1 is a cross-sectional view illustrating an intermediate stage of a microphone according to a conventional manufacturing process. As shown in FIG. 1, an etch process is performed by introducing an etching solution via through-holes of a cover layer 3 into a structure below the cover layer to remove a portion of the structure to form a cavity surrounded by a substrate 1, a vibration membrane 2 and cover layer 3. In this process, vibration membrane 2 may be deformed due to the impact of the etching solution. When vibration membrane 2 is deformed to a certain extent, vibration membrane 2 may be broken, as shown in FIG. 2.

To overcome this problem, a technique of reducing the critical dimension (CD) of the substrate has been proposed. In the proposed technique, when a dry etch process is performed on substrate 1 to form an opening 4, the area of a corresponding mask is reduced so that the peripheral edge of opening 4 can provide support to vibration membrane 2 to prevent breakage during an excessive deformation of the vibration membrane. FIG. 3 is a plan view of a reduction in the size of a mask according to the prior art. Referring to FIG. 3, the mask shown in the left-hand side is a conventional mask, and the mask shown in the right-side is the conventional mask of the left-side that is reduced in size.

However, in this case, when substrate 1 is in contact with vibration membrane 2, the contact area is relatively large and may adversely affects the audio signal, resulting in deterioration of the microphone performance.

BRIEF SUMMARY OF THE INVENTION

In view of the above-described problems, the present inventors provide a novel solution to improve the reliability, yield, and performance of a semiconductor device, and a method for manufacturing the semiconductor device.

In accordance with the present invention, a semiconductor device includes a substrate having an opening extending through the substrate and at least one support member on a sidewall of the opening, a vibration membrane on the substrate, a cover layer on the vibration membrane; and a cavity that is defined by the substrate, the vibration membrane, and the cover layer. The opening exposes a lower surface portion of the vibration membrane, and the at least one support member on a sidewall of the opening provides mechanical support to the vibration membrane in the physical deformation of the vibration membrane to prevent breakage.

In one embodiment, the at least one support member includes multiple support members that are symmetrically arranged on the sidewall of the opening.

In one embodiment, the at least one support member has a lateral width smaller than a lateral width of the opening. In one embodiment, the at least one support member has an upper surface that is flush with an upper surface of the substrate.

In one embodiment, the vibration membrane includes polysilicon. In one embodiment, the cover layer includes at least one through-hole in communication with the cavity. In one embodiment, the cover layer further includes an electrode layer on its lower surface.

Embodiments of the present invention also provides a method for manufacturing a semiconductor device. The method may include providing a semiconductor structure having a substrate, a first sacrificial layer on the substrate, a vibration membrane on the first sacrificial layer, a second sacrificial layer on the vibration membrane, and a cover layer on the second sacrificial layer. The method may further include etching the substrate using a mask having at least one notch on a side to form an opening exposing a lower surface portion of the first sacrificial layer and having at least one support member on a sidewall of the opening, removing a portion of the first sacrificial layer to expose a lower surface portion of the vibration membrane, and removing the second sacrificial layer to form a cavity that is delineated by the substrate, the vibration membrane, and the cover layer.

In one embodiment, the at least one support member has an upper surface flush with an upper surface of the substrate. In one embodiment, the vibration member includes polysilicon.

In one embodiment, removing the second sacrificial layer includes forming a through-hole extending through the cover layer to the second sacrificial layer, and introducing an etching solution via the through-hole to remove the second sacrificial layer.

In one embodiment, the method may further include forming an electrode layer on a lower surface of the cover layer.

In one embodiment, the mask has a square shape, and the at least one notch is a square indentation disposed on a side of the mask.

In one embodiment, the at least one notch includes a plurality of square indentations symmetrical disposed on four sides of the square-shaped mask.

In one embodiment, the at least one notch includes a plurality of rectangular-shaped indentations that are equally spaced on the periphery of the mask. In one embodiment, the rectangular-shaped indentations each have a size of 60 μm by 60 60 μm.

The following detailed description together with the accompanying drawings will provide a better understanding of the nature and advantages of the present invention.

BRIEF DESCRIPTION OF THE DRAWINGS

Embodiments of the present invention are described with reference to the accompanying drawings. In the drawings, like reference numbers may indicate identical or functionally similar elements.

DETAILED DESCRIPTION OF THE INVENTION

Figure 1:
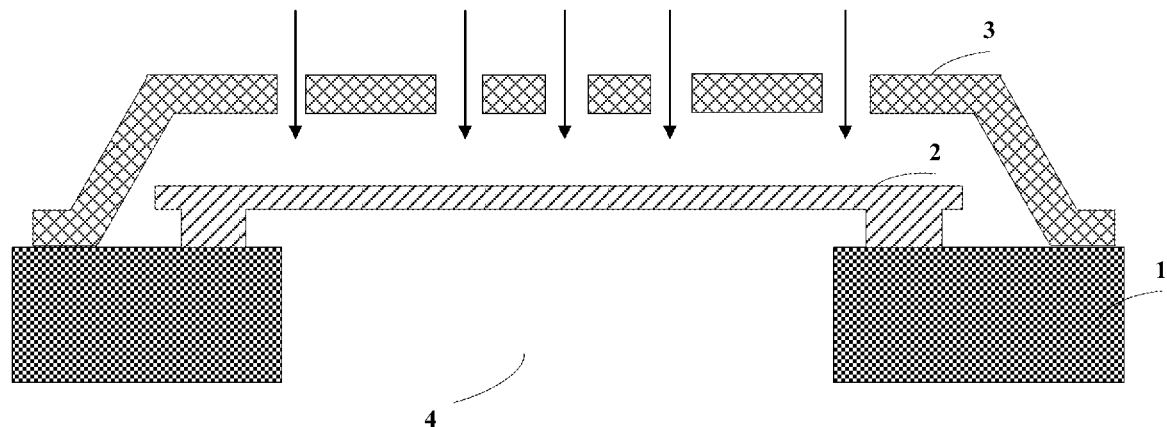
FIG. 1 is a cross-sectional view illustrating an intermediate stage of a microphone according to a conventional manufacturing process.
Figure 2:
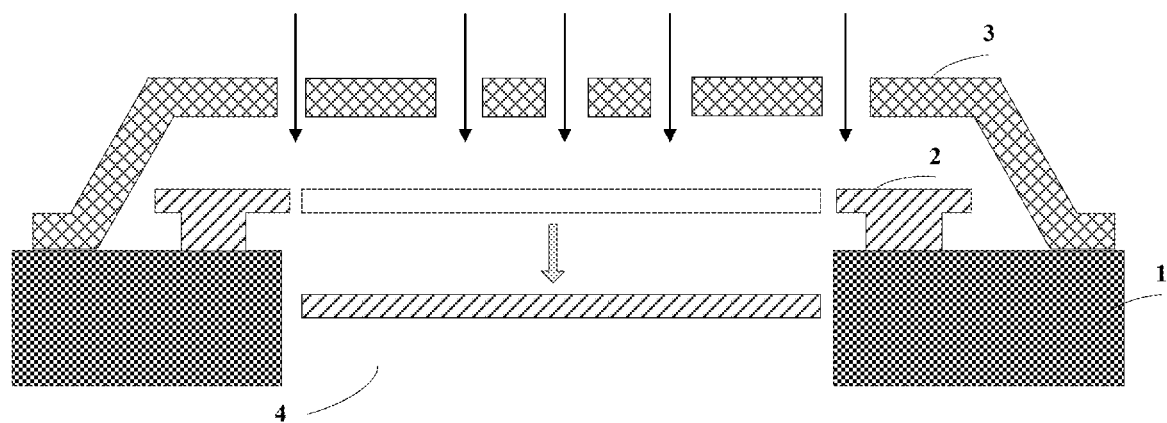
FIG. 2 is a schematic cross-sectional view of a prior art microphone having a rupture or breakage of the vibration membrane during a manufacturing process.
Figure 3:
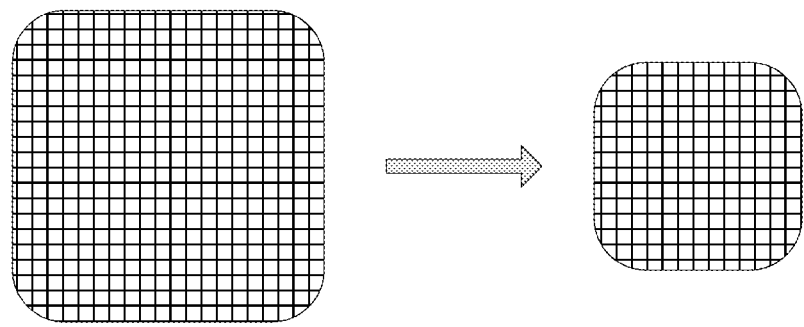
FIG. 3 is a plan view of a size reduction of a mask to prevent breakage according to the prior art.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly, coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a", "an" and "the" may include singular and plural references. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items.

The term "vertical" as used in this application is defined as a plane perpendicular to the conventional plane or surface of a wafer or substrate, regardless of the orientation of the wafer or substrate. The term "horizontal" refers to a direction perpendicular to the vertical as defined above.

The embodiments described and references in the disclosure to "one embodiment," "an embodiment," "an exemplary embodiment" indicate that the embodiments described may include a particular feature, structure, or characteristic. However, every embodiment may not necessary include the particular feature, structure or characteristic. As used throughout this disclosure, the terms "depositing" and "forming" are used interchangeably.

Embodiments of the invention are described herein with reference to cross-section illustrations that are schematic illustrations of idealized embodiments (and intermediate structures) of the invention.

It should be noted that like reference numerals are used to denote like elements, and once an element has been defined in a drawings, it will not be further described in other drawings.

Figure 4:
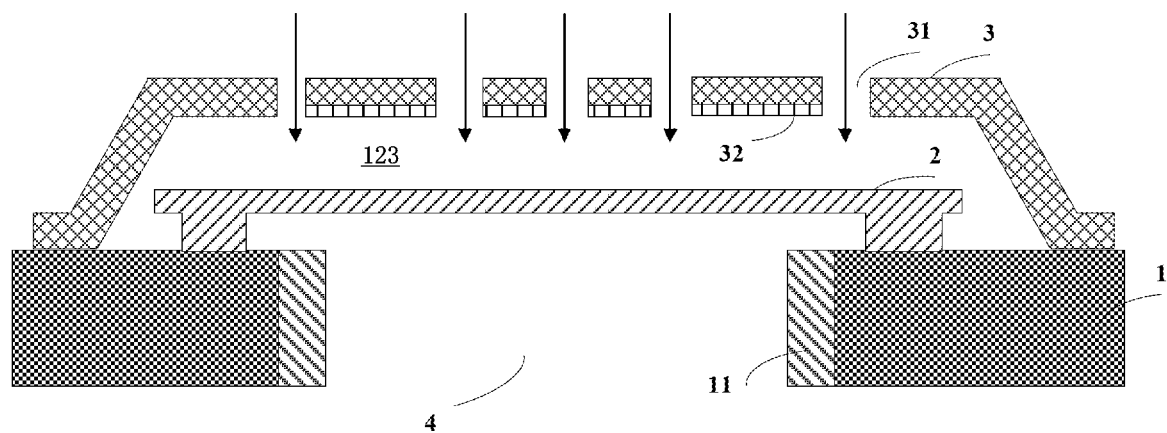
FIG. 4 is a cross-sectional view illustrating a semiconductor device in a manufacturing method according to an embodiment of the present invention.

FIG. 4 is a cross-sectional view illustrating a semiconductor device in a manufacturing method according to an embodiment of the present invention. Referring to FIG. 4, the semiconductor device includes a substrate 1, a vibration membrane 2 on substrate 1, and a cover layer 3 on substrate 1 and vibration membrane 2, and a cavity 123 delineated by substrate 1, vibration membrane 2, and cover layer 3.

In one embodiment, vibration membrane 2 may include polysilicon.

In one embodiment, substrate 1 includes an opening 4 configured to expose a bottom surface portion of vibration membrane 2 and a support member 11 on a sidewall of opening 4.

In one embodiment, support member 11 has a surface that is flush (coplanar) with an upper surface of substrate 1. The upper surface of substrate 1 is the surface facing vibration membrane 2.

Figure 5:
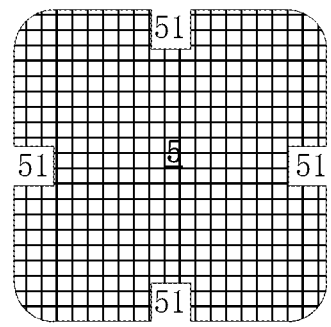
FIG. 5 is a top plan view of a mask according to an embodiment of the present invention.

To prevent deterioration of the signal-to-noise ratio due to the deformation of the vibration membrane while providing mechanical support to the vibration membrane, embodiments of the present invention provide a modification to opening 4. FIG. 5 is a plan view showing a mask 5 according to an embodiment of the present invention. As shown in FIG. 5, mask 5 has at least one notch 51 at its peripheral edge. In one embodiment, mask 5 has a square shape, and the at least one notch includes four rectangular indentations that are equally spaced on the periphery of the square-shaped mask. In one embodiment, mask 5 has a square shape having curved corners, and the at least one notch includes two squared-shaped indentations that are arranged on opposite of the square-shaped mask. In one embodiment, the at least one notch includes four notches each are arranged on each side of the square-shaped mask, preferable the notches (indentations) each are arranged in the middle of each side of the mask. In one embodiment, an etch process is performed on substrate 1 using mask 5 shown in FIG. 5 as a mask to form opening 4.

Figure 6:
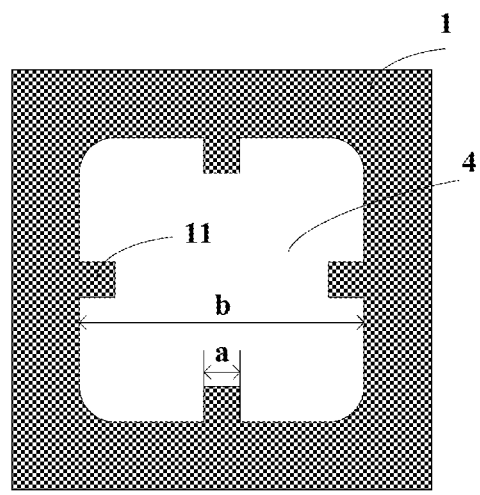
FIG. 6 is a top view of a substrate manufactured using the mask shown in FIG. 5 according to an embodiment of the present invention.

FIG. 6 is a top view of substrate 1 after an etch process has been performed using the mask shown in FIG. 5. Referring to FIG. 6, the location of support member 11 on sidewalls of opening 4 can be determined based on the location of notches (indentations) of the mask. It is understood that the number of notches (i.e., the number of support members 11) of the mask in FIG. 5 can be any integer number. In the example shown in FIG. 5, four notches 51 are used (e.g., one on each side of the mask). But it is understood that the number is arbitrarily chosen for describing the example embodiment and should not be limiting. In one embodiment, support members 11 are symmetrically disposed (evenly distributed) on sidewalls of opening 4. Using a symmetrical arrangement of support members 11, the support provided to the vibration membrane is more balanced when a force is applied to the vibration membrane, thereby effectively reducing vibration membrane breakage that may be caused by an unevenly applied force.

In one embodiment, support member 11 has a lateral width that is smaller than the lateral width of opening 4. In one embodiment, support member 11 has a square-shaped cross section. Referring to FIG. 6, support member 11 has a lateral width "a" that is smaller than the lateral width "b" of opening 4. This arrangement ensures that support member 11 does not increase the contact area between vibration membrane 2 and substrate 1 when vibration membrane 2 is supported by support member 11. In one embodiment, the cross sectional size of support member 11 has a lateral width of 60 microns and a lateral length of 60 microns.

Figure 7:
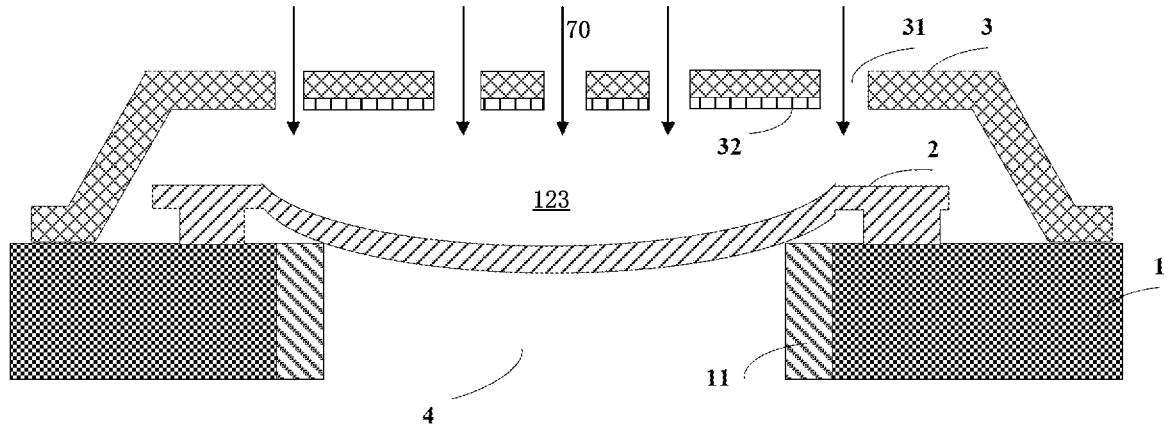
FIG. 7 is a cross-sectional view illustrating a vibration membrane of a semiconductor device in a deformation state according to an embodiment of the present invention.

FIG. 7 is a cross-sectional view illustrating a vibration membrane of a semiconductor device in a deformation state according to an embodiment of the present invention. Referring to FIG. 7, vibration membrane 2 is deformed through the impact of an etching solution 70. However, since support member 11 is provided on sidewalls of opening 4 of substrate 1, support member 11 provides support to deformed vibration membrane 2 to effectively prevent the breakage of vibration membrane 2.

According to the above-described embodiment of the present invention, the semiconductor device includes at least one support member on a sidewall of the opening in the substrate, the support member provides mechanical support to the vibration membrane when the vibration membrane is deformed to effectively reduce the breakage rate of the vibration membrane. Because the contact area between the support member and the vibration membrane is small (significantly smaller than the contact area between the substrate and the vibration membrane as in a conventional microphone), the signal-to-noise ratio of the semiconductor device is not affected.

Referring to FIGS. 4 and 7, cover layer 3 includes at least one through-hole 31 in communication with cavity 123 to enable an etching solution from entering the structure to remove a portion of the structure to form the cavity.

In addition, the semiconductor device includes an electrode layer 32 on a bottom surface of cover layer 31. Electrode layer 32 and vibration membrane 2 from the two electrodes of a capacitor of a microphone. When the microphone is in operation, an acoustic wave causes vibration membrane 2 to move, the movement of the vibration membrane changes the capacitance value of the capacitor that can be converted into an electrical signal.

Figure 8:
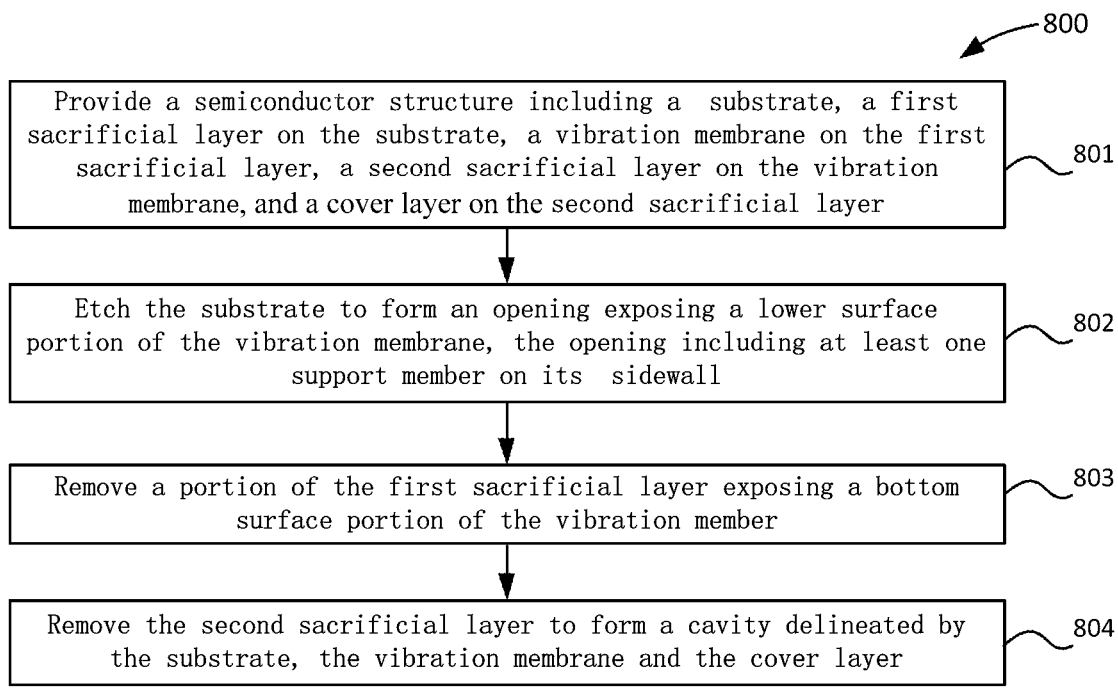
FIG. 8 is a simplified flowchart illustrating a method for manufacturing a semiconductor device according to an embodiment of the present invention.

FIG. 8 is a simplified flowchart illustrating a method for manufacturing a semiconductor device according to an embodiment of the present invention. The method may include the following process steps:

Step 801: providing a semiconductor structure including a substrate, a first sacrificial layer on the substrate, a vibration membrane on the first sacrificial layer, a second sacrificial layer on the vibration membrane, and a cover layer on the second sacrificial layer.

In one embodiment, the vibration membrane includes polysilicon. The semiconductor structure also includes an electrode layer on a lower surface of the cover layer. The lower surface of the cover layer refers to the surface of the cover layer facing toward the substrate.

Step 802: performing an etch process on the substrate to remove a portion of the substrate to form an opening exposing a bottom surface portion of the first sacrificial layer. The etch process also forms at least one support member on a sidewall of the opening.

In one embodiment, the at least one support member includes a plurality of support members that are symmetrically disposed on the sidewall of the opening. Each of the support members has a lateral width that is smaller than the lateral width of the opening, and an upper surface that is flush with the upper surface of the substrate. In one embodiment, the opening has a square shape, and the plurality of support members have four support members that are evenly disposed on each side of the square shaped opening.

Step 803: removing a portion of the first sacrificial layer to expose a lower surface portion of the vibration membrane.

Step 804: removing the second sacrificial layer to form a cavity that is delineated by the substrate, the vibration membrane, and the cover layer.

In one embodiment, removing the second sacrificial layer may include forming at least one through-hole extending through the cover layer to the second sacrificial layer, and removing the second sacrificial layer by introducing an etching solution via the at least one through-hole.

Embodiments of the present invention provide a method for manufacturing a semiconductor device that includes at least one support member on a sidewall of the opening in the substrate, the support member provides mechanical support to the vibration membrane when the vibration membrane is deformed when an etching solution is introduced to the semiconductor device to form a cavity. The support member can effectively prevent the vibration membrane from breaking. Because the contact area between the support member and the vibration membrane is small (significantly smaller than the contact area between the substrate and the vibration membrane in a conventional microphone), the signal-to-noise ration of the semiconductor device is not adversely affected.

A method for manufacturing a semiconductor device according to an example embodiment of the present invention will be described in detail below with reference to FIGS. 9A to 9E.

Figure 9A:
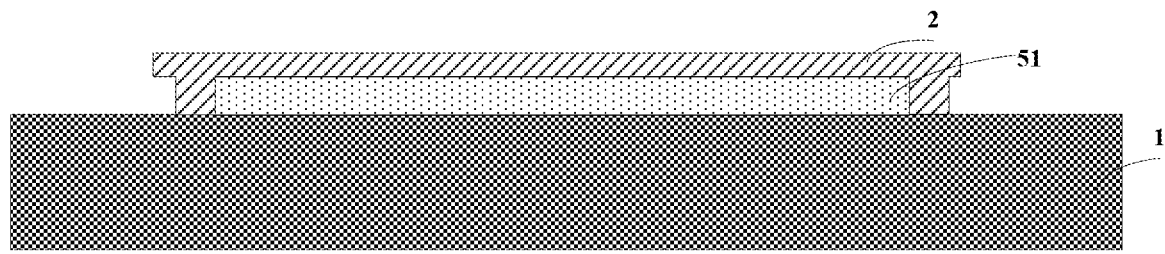
FIG. 9A to 9E are cross-sectional views illustrating intermediate stages of a semiconductor device in a manufacturing method according to an embodiment of the present invention.

Referring to FIG. 9A, a substrate 1 is provided. A first sacrificial layer 51 is formed on substrate 1. A vibration membrane 2 is formed on first sacrificial layer 51.

Figure 9B:
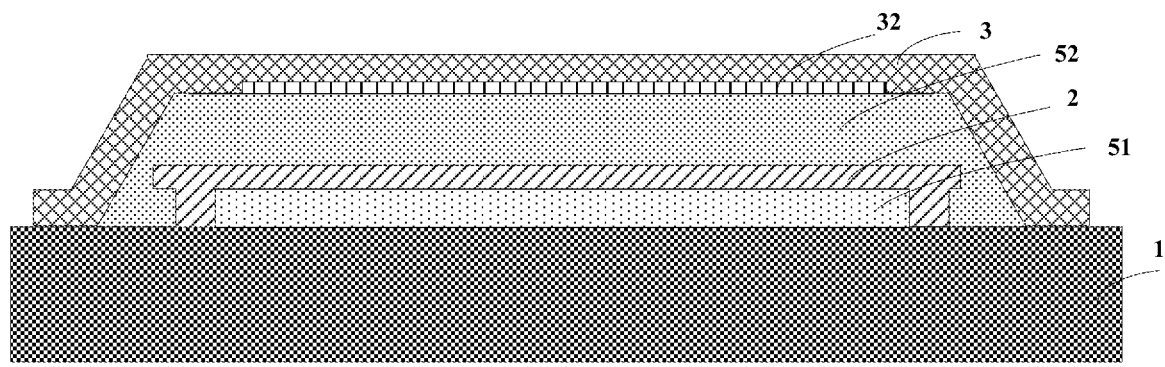

Referring to FIG. 9B, a second sacrificial layer 52 is formed on vibration membrane 2 and on substrate 1. A cover layer 3 is formed on substrate 1 and on second sacrificial layer 52. An electrode layer 32 is formed on a lower surface portion of cover layer 3. The lower surface portion of cover layer 3 is the surface facing the substrate.

Figure 9C:
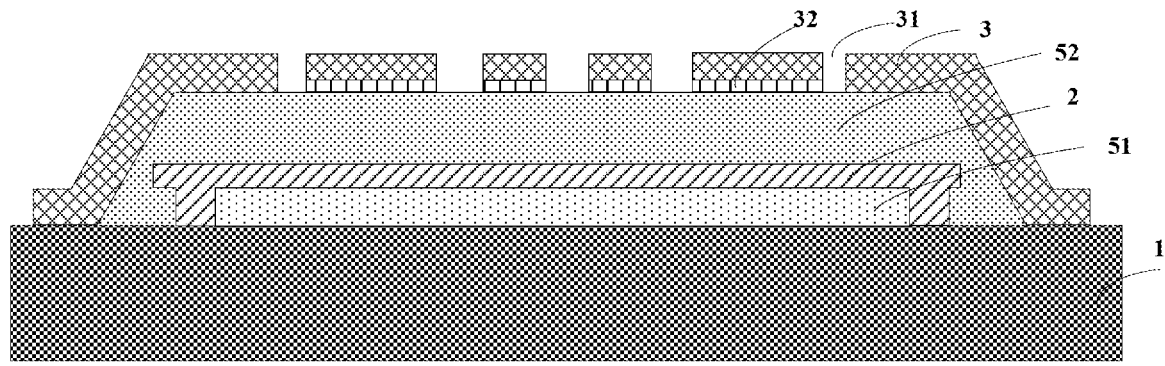

Referring to FIG. 9C, cover layer 3 is patterned to form at least one through-hole 31 exposing a surface of second sacrificial layer 52.

Figure 9D:
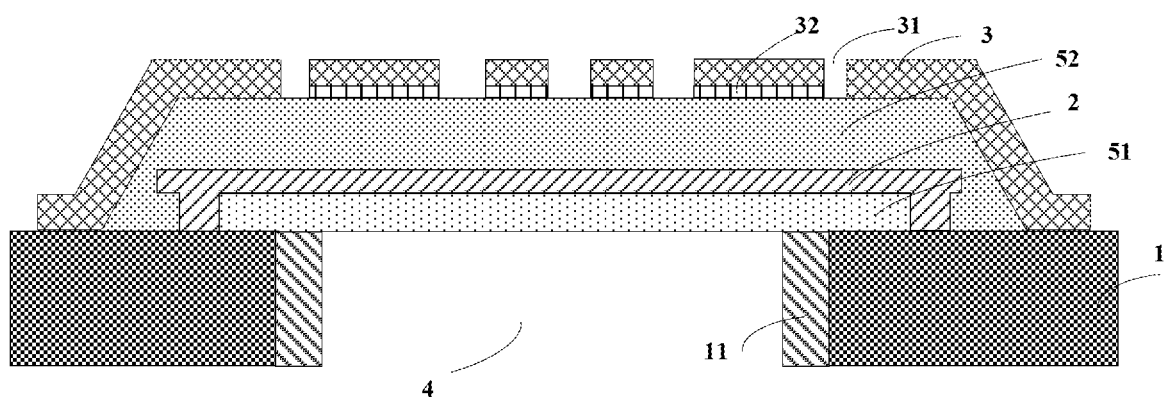

Referring to FIG. 9D, substrate 1 is etched using the mask shown in FIG. 5 as a mask to form an opening 4 that exposes a lower surface portion of first sacrificial layer 51. Opening 4 has at least one support member 11 on its sidewall.

Figure 9E:
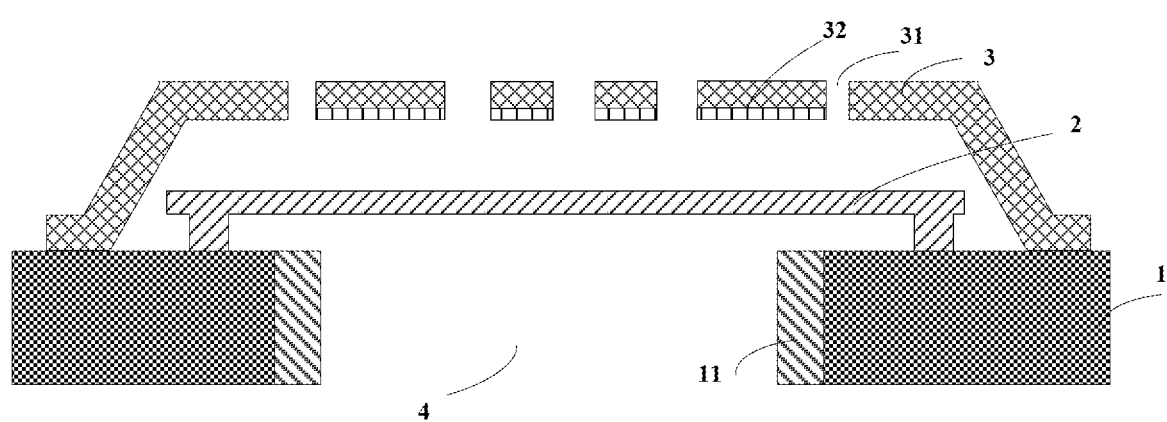

Referring to FIG. 9E, first sacrificial layer 51 and second sacrificial layer 52 are removed using a wet etch process to expose the lower and upper surfaces of vibration membrane 2, respectively.

In the embodiment, since support member 11 is provided on the sidewall of opening 4 in substrate 1, support member 11 will provide support to vibration membrane 2 when vibration membrane 2 is deformed to prevent breakage of vibration membrane 2. And the small contact area between support member 11 and vibration membrane 2 does not adversely affect the signal-to-noise ratio of the semiconductor device.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A semiconductor device, comprising:
a substrate having an opening extending through the substrate and at least one support member on a sidewall of the opening, the at least one support member having a thickness substantially equal to a thickness of the substrate and comprising a plurality of square-shaped protrusions each having a lateral width equal to a lateral length;
a vibration membrane on the substrate;
a cover layer on the vibration membrane; and
a cavity delineated by the substrate, the vibration membrane, and the cover layer;
wherein the opening exposes a lower surface portion of the vibration membrane.

2. The semiconductor device of claim 1, wherein the at least one support member comprises a plurality of support members symmetrically arranged on the sidewall of the opening.

3. The semiconductor device of claim 1, wherein the lateral width of a square-shaped protrusion is smaller than a lateral width of the opening.

4. The semiconductor device of claim 1, wherein the at least one support member has an upper surface flush with an upper surface of the substrate.

5. The semiconductor device of claim 1, wherein the vibration membrane comprises polysilicon.

6. The semiconductor device of claim 1, wherein the cover layer comprises at least one through-hole in communication with the cavity.

7. The semiconductor device of claim 6, wherein the cover layer further comprises an electrode layer on a lower surface of the cover layer.

8. The semiconductor device of claim 1, wherein the plurality of square-shaped protrusions are evenly spaced on the sidewall of the opening.

9. The semiconductor device of claim 1, wherein the plurality of square-shaped protrusions are symmetrically disposed on the sidewall of the opening.

10. The semiconductor device of claim 1, wherein the opening comprises a square-shaped cross section having four curved corners.

11. The semiconductor device of claim 10, wherein the plurality of square-shaped protrusions comprise four protrusions, each of the four protrusions being arranged between two adjacent curved corners at an equal distance.

* * * * *